United States Patent
Furutani

(10) Patent No.: US 8,390,396 B2
(45) Date of Patent: Mar. 5, 2013

(54) DUPLEXER MODULE

(75) Inventor: Koji Furutani, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/192,497

(22) Filed: Jul. 28, 2011

(65) Prior Publication Data

US 2011/0279193 A1 Nov. 17, 2011

Related U.S. Application Data

(63) Continuation of application No. PCT/JP2010/050904, filed on Jan. 25, 2010.

(30) Foreign Application Priority Data

Jan. 29, 2009 (JP) ................. 2009-018282

(51) Int. Cl.
*H03H 7/46* (2006.01)
*H01P 5/12* (2006.01)
(52) U.S. Cl. ............. 333/132; 333/126; 333/129
(58) Field of Classification Search .......... 333/126–129, 333/132, 134
See application file for complete search history.

(56) References Cited

U.S. PATENT DOCUMENTS

| 6,759,924 B2 * | 7/2004 | Sakuragawa et al. ......... 333/133 |
| 2007/0080757 A1 | 4/2007 | Yahata et al. |
| 2011/0260806 A1 * | 10/2011 | Takeuchi ................. 333/103 |

FOREIGN PATENT DOCUMENTS

| JP | 06-350306 A | 12/1994 |
| JP | 2001-094459 A | 4/2001 |
| JP | 2001-251206 A | 9/2001 |
| JP | 2003-179464 A | 6/2003 |
| JP | 2005-123909 A | 5/2005 |
| JP | 2007-110202 A | 4/2007 |

OTHER PUBLICATIONS

Official Communication issued in International Patent Application No. PCT/JP2010/050904, mailed on Mar. 16, 2010.

Official Communication issued in corresponding Japanese Patent Application No. 2010-548498, mailed on Jul. 31, 2012.

* cited by examiner

*Primary Examiner* — Robert Pascal
*Assistant Examiner* — Kimberly Glenn
(74) *Attorney, Agent, or Firm* — Keating & Bennett, LLP

(57) ABSTRACT

A duplexer module that prevents degradation of isolation between signal lines includes transmission filters, reception filters, phase adjusting circuits, and a multilayer substrate. The transmission filters and the reception filters are constituted as separate discrete components. The multilayer substrate includes filter mount terminals to which the transmission filters are mounted, and filter mount terminals to which the reception filters are mounted. The filter mount terminals are arranged along an upper side of the multilayer substrate, and the filter mount terminals are arranged along a lower side of the multilayer substrate.

6 Claims, 4 Drawing Sheets

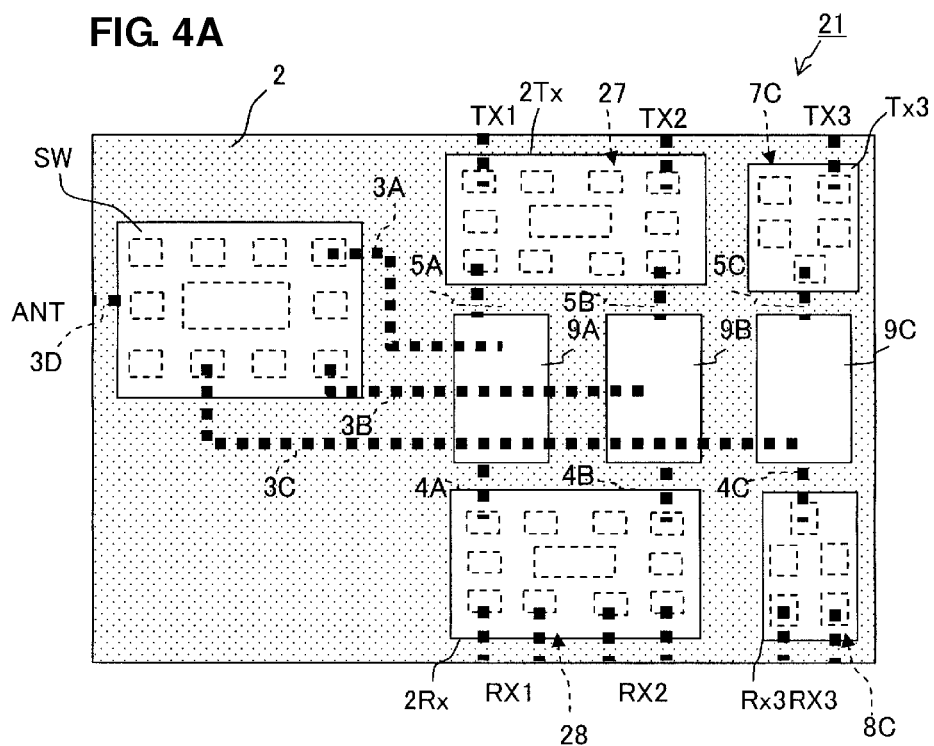
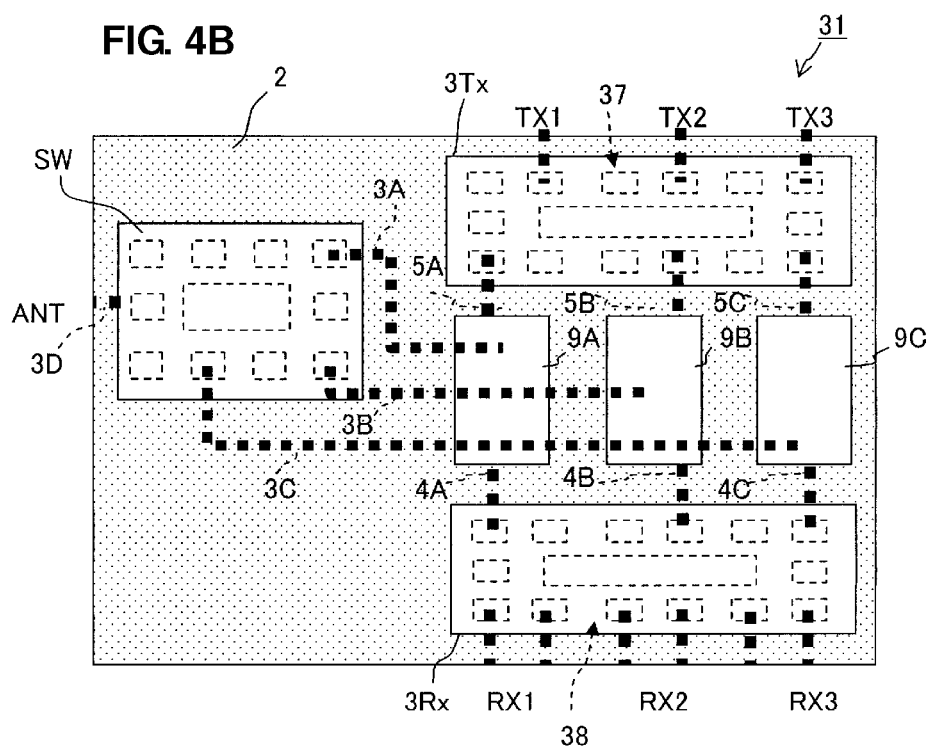

DUPLEXER MODULE

BACKGROUND OF THE INVENTION

1. Field of the Invention

The present invention relates to a duplexer module including a duplexer that is disposed on a printed board or a multilayer substrate.

2. Description of the Related Art

A duplexer module for separating a transmission signal and a reception signal is included in a front-end unit, such as a cellular phone. In general, a duplexer module is mounted on a mount device, e.g., a printed board, by using mounting electrodes formed on a mounting surface of a module substrate. Further, discrete components are mounted to surface electrodes formed on a chip mounting surface of the module substrate. The mounting electrodes and the surface electrodes are connected through a via holes filled with a conductive material, and pattern electrodes. A transmission filter and a reception filter are disposed respectively in a transmission line and a reception line.

A duplexer module including a plurality of duplexers adapted for different target signal frequency bands is often utilized in a multi-band front-end unit (see, e.g., Japanese Unexamined Patent Application Publication No. 2005-123909). In that type of duplexer module, each duplexer is constituted as a discrete component in which a transmission filter and a reception filter are integrated with each other. The discrete components including the duplexers are arranged adjacent to each other in such a state that respective input terminals are oriented in the same direction and respective output terminals are also oriented in the same direction.

With repeated reduction in the size of the duplexer module, it becomes difficult to arrange a transmission line through which a transmission signal passes and a reception line through which a reception signal passes, while still being able to maintain a sufficient spacing between both the lines. In the multi-band adapted duplexer module mentioned above, particularly, interconnection lines for individual duplexers have to be arranged in a partially crossing relationship and isolation between signal lines tends to deteriorate in some cases. In particular, when a discrete component including a transmission filter and a reception filter in an integrated state is used, the transmission filter and the reception filter are positioned closer to each other, and isolation between signal lines in which the transmission filter and the reception filter are inserted, respectively, tends to deteriorate.

SUMMARY OF THE INVENTION

Accordingly, preferred embodiments of the present invention provide a duplexer module that prevents deterioration of isolation between signal lines.

According to a preferred embodiment of the present invention, a duplexer module includes a transmission line, a reception line, and an antenna line, the duplexer module further including a transmission filter, a reception filter, a phase adjusting circuit, and a module substrate. The transmission line transfers a transmission signal. The reception line transfers a reception signal. The antenna line transfers the transmission signal and the reception signal. The transmission filter is inserted in the transmission line and allows passage of the transmission signal. The reception filter is inserted in the reception line and allows passage of the reception signal. A transmission filter mount terminal and a reception filter mount terminal are provided on the module substrate. The transmission filter is mounted to the transmission filter mount terminal. The reception filter is mounted to the reception filter mount terminal. The transmission filter is arranged along a first side of the module substrate, and the reception filter is arranged along a second side of the module substrate, the second side being positioned opposite to the first side.

With the arrangement described above, the transmission filter and the reception filter are constituted as separate discrete components. Therefore, the transmission filter can be arranged along the first side of the module substrate, and the reception filter can be arranged along the second side of the module substrate, the second side being positioned opposite to the first side. Hence, the spacing between the transmission filter and the reception filter can be increased. Further, the spacing between the transmission filter mount terminal and the reception filter mount terminal to which the transmission filter and the reception filter are connected, respectively, and the spacing between interconnection lines connected to those terminals can be increased. As a result, deterioration of isolation caused by coupling between the lines is prevented. Moreover, each line can be more easily routed, and the transmission line, the reception line, and the antenna common line can be connected without crossing each other, whereby the isolation between the lines is more positively ensured. In addition, lengths of the interconnection lines can be shortened and insertion losses of the interconnection lines can be reduced.

A phase adjusting circuit to be disposed at a point connecting the antenna line, the transmission filter, and the reception filter may be arranged between the transmission filter and the reception filter. In such a case, preferably, the transmission filter and the reception filter are arranged such that respective electrodes of the transmission filter and the reception filter, which electrodes are connected to the phase adjusting circuit, are adjacent to the phase adjusting circuit. As a result, lengths of the interconnection lines between both the filter mount terminals and the phase adjusting circuit can be shortened and insertion losses of the interconnection lines can be reduced.

In the module substrate, preferably, an interconnection line constituting the transmission line, an interconnection line constituting the reception line, and an interconnection line constituting the antenna line are arranged at different positions in a direction normal to the substrate. With such an arrangement, since the interconnection lines are not positioned so as to face each other in the same plane, the isolation between the lines can be further ensured.

The duplexer module may include plural sets of the transmission line, the reception line, and the antenna line, and a high-frequency switch arranged to select the antenna line in one of the plural sets and connect the selected antenna line to an antenna port. With such an arrangement, a duplexer module of SWITCHPLEXER™ type can be constituted.

Preferably, the phase adjusting circuit includes a capacitor inserted between a connecting point at which the transmission line, the reception line, and the antenna line are connected and the high-frequency switch, and an inductor inserted between the connecting point and a ground. The phase adjusting circuit thus constituted can reduce the number of circuit elements in comparison with the case where a phase adjusting circuit dedicated for the high-frequency switch and a phase adjusting circuit dedicated for the duplexer are separately disposed. It is hence possible to reduce the size of the module substrate, to improve the communication performance, and to cut the production cost.

Preferably, the plural transmission filters disposed in the plural transmission lines are constituted as one discrete component, and the plural reception filters disposed in the plural reception lines are constituted as one discrete component.

With such an arrangement, the number of discrete components mounted to the module substrate and the size of the module substrate can be reduced. It is hence possible to cut the production cost, to simplify the production process, and to reduce the size of the module substrate.

Preferably, the high-frequency switch and the phase adjusting circuit are arranged in different principal surface of the module substrate. With such an arrangement, the size of the module substrate can be reduced, the interconnection lines between the high-frequency switch and the phase adjusting circuit can be constituted by using via electrodes. In that case, the interconnection lines between the high-frequency switch and the phase adjusting circuit in different sets can be prevented from crossing each other. As a result, isolation between different sets of the lines can be more positively ensured and the communication performance, e.g., reception sensitivity, can be improved.

According to various preferred embodiments of the present invention, since the transmission filter and the reception filter are arranged along the opposite sides of the module substrate, the spacing between the transmission filter and the reception filter can be increased. Further, the spacing between the transmission filter mount terminal and the reception filter mount terminal to which the transmission filter and the reception filter are mounted, respectively, and the spacing between the interconnection lines connected to those terminals can be increased. As a result, deterioration of the isolation caused by coupling between the lines can be prevented, and the communication performance, e.g., reception sensitivity, can be improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A and 4B illustrate examples of configuration of duplexer modules according to other preferred embodiments of the present invention.

DETAILED DESCRIPTION OF THE PREFERRED EMBODIMENTS

Figure 1A:
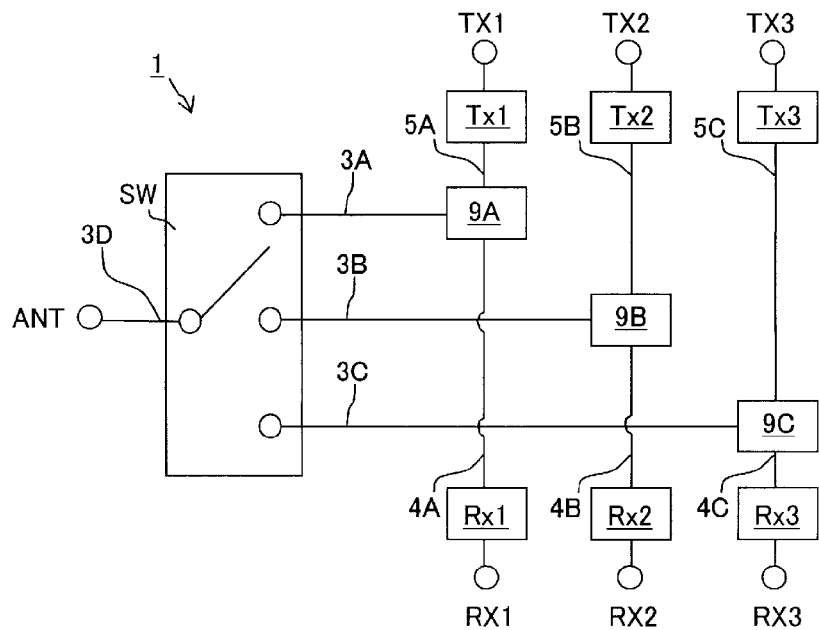
FIGS. 1A and 1B illustrate an example of configuration of a duplexer module according to a first preferred embodiment of the present invention.
Figure 1B:
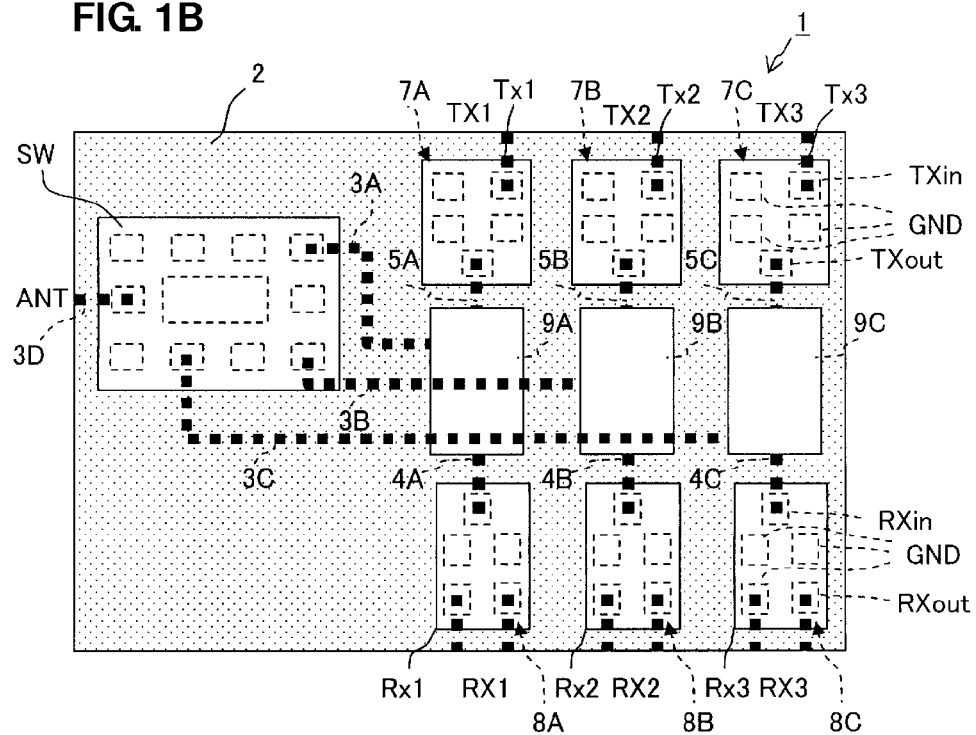

FIGS. 1A and 1B illustrate an example of configuration of a duplexer module according to a first preferred embodiment of the present invention.

A duplexer module 1 constitutes a duplexer module of SWITCHPLEXER™ type in which three duplexers adapted for three communication systems differing in target frequency band are connected by a high-frequency switch.

FIG. 1A is a schematic equivalent circuit diagram of the duplexer module 1. The duplexer module 1 includes antenna switching lines 3A to 3C, an antenna common line 3D, reception lines 4A to 4C, transmission lines 5A to 5C, transmission filters Tx1 to Tx3, reception filters Rx1 to Rx3, and phase adjusting circuits 9A to 9C. The antenna switching lines 3A to 3C and the antenna common line 3D correspond to an antenna line (or antenna lines) according to a preferred embodiment of the present invention.

The antenna common line 3D includes an antenna port ANT defining an external connection port. A high-frequency switch SW selects one of the antenna switching lines 3A to 3C and connects the selected one to the antenna common line 3D. The phase adjusting circuit 9A connects the antenna switching line 3A, the reception line 4A, and the transmission line 5A. The phase adjusting circuit 9B connects the antenna switching line 3B, the reception line 4B, and the transmission line 5B. The phase adjusting circuit 9C connects the antenna switching line 3C, the reception line 4C, and the transmission line 5C. The antenna switching lines 3A to 3D transfer transmission signals and reception signals. Each of the phase adjusting circuits 9A to 9C performs impedance matching among the lines connected thereto.

The reception lines 4A to 4C include reception ports RX1 to RX3 as external connection ports and include reception filters Rx1 to Rx3 inserted therein, respectively. The transmission lines 5A to 5C include transmission ports TX1 to TX3 as external connection ports and include transmission filters Tx1 to Tx3 inserted therein, respectively. The reception lines 4A to 4C transfer the reception signals, and the reception filters Rx1 to Rx3 allow passage of the reception signals in respective predetermined frequency bands. The transmission lines 5A to 5C transfer the transmission signals, and the transmission filters Tx1 to Tx3 allow passage of the transmission signals in respective predetermined frequency bands.

FIG. 1B is a top view of the duplexer module 1. The duplexer module 1 includes a multilayer substrate 2 that corresponds to a module substrate according to a preferred embodiment of the present invention. The multilayer substrate 2 is formed preferably by stacking a plurality of substrates each made of a ceramic or a resin, for example. The other principal surface of the multilayer substrate 2, which does not appear in the drawing, i.e., a bottom surface of the multilayer substrate 2, defines a module mounting surface and includes a plurality of mounting electrodes that function as external connection ports of the duplexer module 1. One principal surface of the multilayer substrate 2, which appears in the drawing, i.e., a top surface of the multilayer substrate 2, includes surface electrodes to which discrete components are mounted. Pattern electrodes and via electrodes disposed inside the multilayer substrate 2 establish connections between the surface electrodes and between the surface electrodes and the mounting electrodes.

The transmission filters Tx1 to Tx3 and the reception filters Rx1 to Rx3 are each a discrete component constituted as a surface acoustic filter including IDT electrodes and are mounted, at terminals provided in bottom surfaces of the components, to filter mount terminals 7A to 7C and 8A to 8C provided in the top surface of the multilayer substrate 2, respectively. The filter mount terminals 7A to 7C are arrayed along an upper side of the multilayer substrate 2 as viewed in FIG. 1B, and the filter mount terminals 8A to 8C are arrayed along a lower side of the multilayer substrate 2 as viewed in FIG. 1B. Herein, the transmission filters Tx1 to Tx3 are of the unbalanced input-unbalanced output type, and the reception filters Rx1 to Rx3 are of the unbalanced input-balanced output type.

The filter mount terminal 7C includes a surface electrode TXin, a surface electrode TXout, and a surface electrode GND. The filter mount terminals 7A and 7B also have the same structure as that of the filter mount terminal 7C. The surface electrode TXin defines a surface electrode to input the transmission signal to the transmission filter. The surface electrode TXout defines a surface electrode to output the transmission signal from the transmission filter. The surface electrode GND defines a surface electrode to connect to the ground potential.

The filter mount terminal 8C includes a surface electrode RXin, a surface electrode RXout, and a surface electrode GND. The filter mount terminals 8A and 8B also have the same structure as that of the filter mount terminal 8C. The surface electrode RXin defines a surface electrode to input the reception signal to the reception filter. The surface electrode RXout defines a surface electrode to perform balanced outputting of the reception signal from the reception filter. The surface electrode GND defines a surface electrode to connect to the ground potential.

In the duplexer module 1, the transmission filters Tx1 to Tx3 are arrayed along the upper side of the substrate as viewed in FIG. 1B, which corresponds to a first side according to a preferred embodiment of the present invention, and the reception filters Rx1 to Rx3 are arrayed along the lower side of the substrate as viewed in FIG. 1B, which corresponds to a second side according to a preferred embodiment of the present invention. Further, the phase adjusting circuits 9A to 9C are arrayed at positions between the transmission filters Tx1 to Tx3 and the reception filters Rx1 to Rx3, respectively. With such a layout, the spacing between the transmission filters Tx1 to Tx3 and the reception filters Rx1 to Rx3 can be increased. In addition, it is also possible to increase the spacing between the filter mount terminals 7A to 7C and the filter mount terminals 8A to 8C to which the filters Tx1 to Tx3 and filters Rx1 to Rx3 are mounted, respectively, and the spacing between interconnection lines connected to the filter mount terminals 7A to 7C and interconnection lines connected to the filter mount terminals 8A to 8C.

Further, the antenna switching line 3A, the transmission line 5A, and the reception line 4A are connected without crossing each other. The antenna switching line 3B, the transmission line 5B, and the reception line 4B are connected without crossing each other. The antenna switching line 3C, the transmission line 5C, and the reception line 4C are connected without crossing each other. The antenna switching lines 3A to 3C, the transmission lines 5A to 5C, and the reception lines 4A to 4C are denoted by dotted lines in FIG. 1B and are constituted by pattern electrodes and via electrodes, which are located on the surface and the inside of the multilayer substrate 2.

Moreover, the filter mount terminals 7A to 7B are arranged such that their surface electrodes TXout to output the transmission signals are oriented downwards as viewed in FIG. 1B, and the surface electrodes TXout are connected respectively to the phase adjusting circuits 9A to 9C that are arranged below the surface electrodes TXout. The filter mount terminals 8A to 8B are arranged such that their surface electrodes RXin to input the reception signals are oriented upwards as viewed in FIG. 1B, and the surface electrodes RXin are connected respectively to the phase adjusting circuits 9A to 9C that are arranged above the surface electrodes RXin. With such a layout, lengths of the interconnection lines between the surfaces electrodes TXout and the phase adjusting circuits 9A to 9C and lengths of the interconnection lines between the surfaces electrodes RXin and the phase adjusting circuits 9A to 9C can be shortened.

Accordingly, isolation between the lines is more positively ensured. Further, insertion losses due to the interconnection lines between the phase adjusting circuits 9A to 9C and the surface electrodes of the filter mount terminals 7A to 7B and 8A to 8B can be reduced, whereby the communication performance of the duplexer module 1 can be improved.

Various preferred embodiments of the present invention can also be satisfactorily applied to the case where only one duplexer made up of one transmission filter, one reception filter, and one phase adjusting circuit is constituted in the form of a module without providing the high-frequency switch SW. Further, another preferred embodiment of the present invention can be satisfactorily applied to the case where one or more other circuit elements are inserted in each line.

Figure 2A:
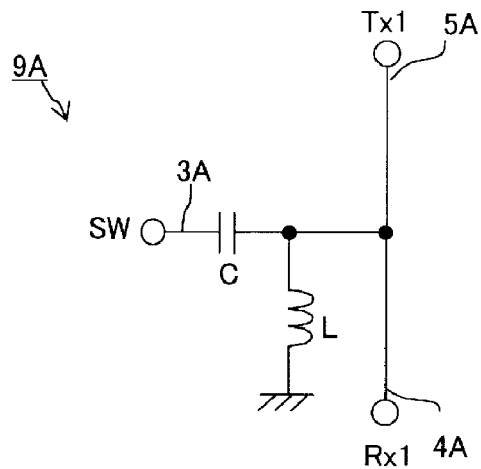
FIGS. 2A-2C illustrate examples of circuit configuration of a phase adjusting circuit disposed in the duplexer module.

FIG. 2A illustrates an example of circuit configuration of the phase adjusting circuit 9A. It should be noted that the phase adjusting circuits 9B and 9C also preferably have the same configuration as that of the phase adjusting circuit 9A.

The phase adjusting circuit 9A includes the antenna switching line 3A, the reception line 4A, the transmission line 5A, a capacitor C, and an inductor L. The phase adjusting circuit 9A performs impedance matching among the antenna switching line 3A, the reception line 4A, and the transmission line 5A. The capacitor C is arranged in series in the antenna switching line 3A, and it cuts off leakage of a DC current from the high-frequency switch SW. The inductor L is inserted between a connecting point at which the antenna switching line 3A, the reception line 4A, and the transmission line 5A are connected and the ground, and it adjusts the impedance of the antenna common line 3A.

Figure 2B:
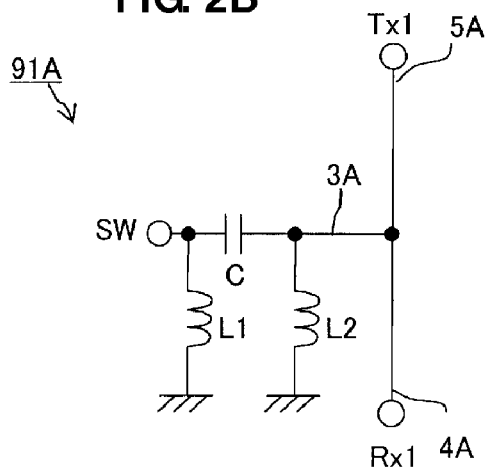

FIG. 2B illustrates another example of circuit configuration of the phase adjusting circuit. A phase adjusting circuit 91A of this example includes a phase adjusting inductor L1 previously associated with the high-frequency switch SW, and an inductor L2. Comparing the phase adjusting circuit 91A and the phase adjusting circuit 9A, the phase adjusting circuit 9A is more preferable from the viewpoint of reducing the module size, improving the communication performance, and cutting the production cost because the phase adjusting circuit 9A including the inductor L, which is shared by the high-frequency switch SW and the duplexer, has a smaller number of circuit elements than the phase adjusting circuit 91A. On the other hand, the phase adjusting circuit 91A is more advantageous from the viewpoint of being able to widen a phase adjustment range and to establish a more accurate match with a predetermined phase because the number of circuit elements usable for the phase adjustment is increased to three in the phase adjusting circuit 91A.

Figure 2C:
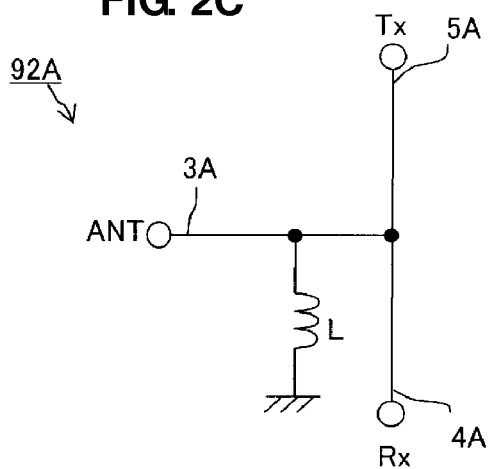

The circuit elements of the phase adjusting circuit may be integrated into a discrete component. As an alternative, part or all of the circuit elements may be constituted by using the pattern electrodes and/or the via electrodes, which are formed in the multilayer substrate 2. When the antenna switching line 3A is directly connected to the antenna port without employing the high-frequency switch SW, the capacitor C is not always required as in an example of configuration of a phase adjusting circuit 92A illustrated in FIG. 2C.

Figure 3A:
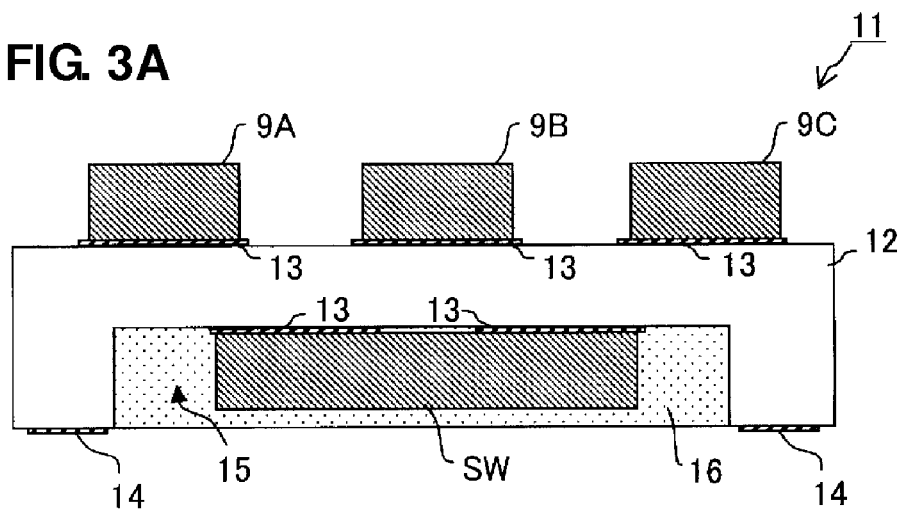
FIGS. 3A and 3B illustrate an example of configuration of a duplexer module according to a second preferred embodiment of the present invention.
Figure 3B:
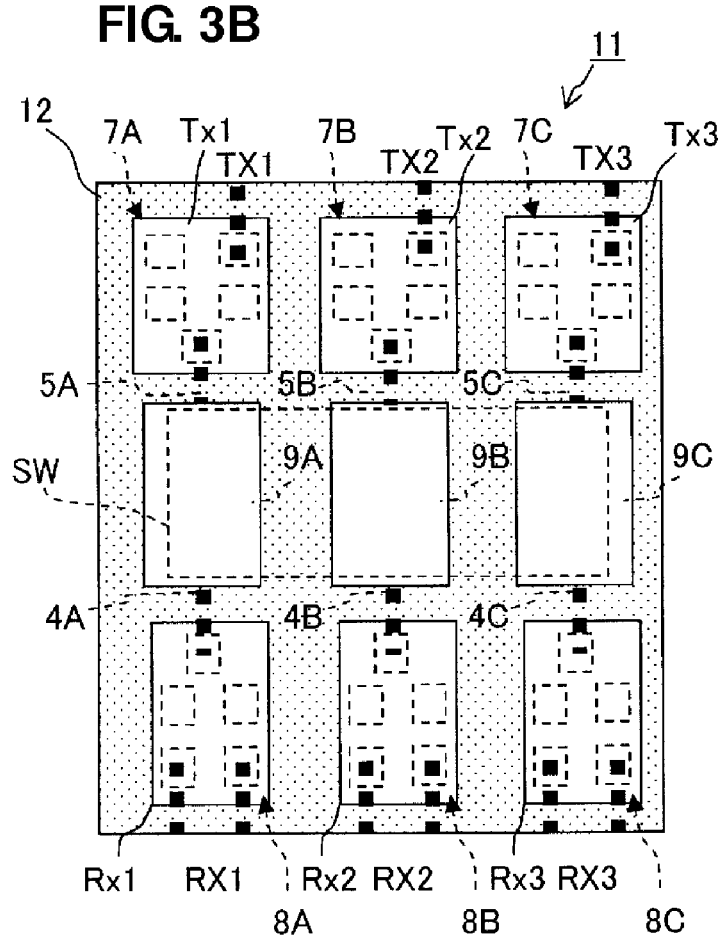

FIGS. 3A and 3B illustrate an example of configuration of a duplexer module according to a second preferred embodiment of the present invention. FIG. 3A is a side sectional view of a duplexer module 11, and FIG. 3B is a top view of the duplexer module 11. It should be noted that, in the following, similar constituent elements to those in the first preferred embodiment are denoted by the same symbols and description of those constituent elements is omitted. The duplexer module 11 according to the second preferred embodiment preferably has the same circuit configuration as that in the first preferred embodiment, but it differs from the first preferred embodiment in the position where the high-frequency switch SW is arranged.

The duplexer module 11 includes a multilayer substrate that corresponds to the module substrate according to a preferred embodiment of the present invention. The multilayer substrate 12 is formed preferably by stacking a plurality of substrates each made of a ceramic or a resin. A top surface of the multilayer substrate 12 includes surface electrodes 13 to which discrete components are mounted. The transmission filters Tx1 to Tx3, the reception filters Rx1 to Rx3, and respective sets of circuit elements of the phase adjusting circuits 9A to 9C are mounted as discrete components to those surface electrodes 13. A bottom surface of the multilayer substrate 12 defines a module mounting surface and includes a plurality of mounting electrodes 14 that serve as external connection ports of the duplexer module 11. A recess 15 is formed in the module mounting surface of the multilayer substrate 2. The high-frequency switch SW is mounted to a bottom surface of the recess 15, and the recess 15 is filled with a mold resin 16. Pattern electrodes and via electrodes provided inside the multilayer substrate 12 establish connections between the surface electrodes 13 and between the surface electrodes 13 and the mounting electrodes 14.

The high-frequency switch SW and the phase adjusting circuits 9A to 9C are mounted respectively to two principal surfaces of the multilayer substrate 2 in an overlapped relation as viewed in a direction normal to the substrate. With such a layout, the size of the multilayer substrate 2 can be reduced. Further, since the high-frequency switch SW and the phase adjusting circuits 9A to 9C can be connected through the via electrodes, the interconnection lines between the high-frequency switch SW and the phase adjusting circuits 9A to 9C can be arranged without crossing each other. As a result, isolation between the interconnection lines can be more positively ensured and the communication performance, e.g., reception sensitivity, can be improved.

FIGS. 4A and 4B illustrate examples of configuration of duplexer modules according to other preferred embodiments of the present invention. FIG. 4A is a top view of a duplexer module 21, and FIG. 4B is a top view of a duplexer module 31. It should be noted that, in the following, similar constituent elements to those in the first preferred embodiment are denoted by the same symbols and description of those constituent elements is omitted. The duplexer modules 21 and 31 have the same circuit configuration as that in the first preferred embodiment, but they differ from the first preferred embodiment in configuration of transmission filters and reception filters.

In the duplexer module 21, the transmission filter Tx1 and the transmission filter Tx2 in the first preferred embodiment are constituted as a transmission filter chip 2Tx that is an integrated discrete component. Also, the reception filter Rx1 and the reception filter Rx2 in the first preferred embodiment are constituted as a reception filter chip 2Rx that is an integrated discrete component. The transmission filter chip 2Tx and the reception filter chip 2Rx are each a surface acoustic filter including IDT electrodes and are mounted, at terminals provided in bottom surfaces of the filters, to filter mount terminals 27 and 28 provided in the top surface of the multilayer substrate 2, respectively.

In the duplexer module 31, the transmission filter Tx1, the transmission filter Tx2, and the transmission filter Tx3 in the first preferred embodiment are constituted as a transmission filter chip 3Tx that is an integrated discrete component. Also, the reception filter Rx1, the reception filter Rx2, and the reception filter Rx3 in the first preferred embodiment are constituted as a reception filter chip 3Rx that is an integrated discrete component. The transmission filter chip 3Tx and the reception filter chip 3Rx are each a surface acoustic filter including IDT electrodes and are mounted, at terminals provided in bottom surfaces of the filters, to filter mount terminals 37 and 38 provided in the top surface of the multilayer substrate 2, respectively.

The number of discrete components mounted to the multilayer substrate 2 and the size of the multilayer substrate 2 can be reduced by, as described above, constituting the plural transmission filters in the form of an integrated module component and the plural reception filters in the form of an integrated module complement. As a result, the production cost can be greatly reduced and the production process can be simplified.

The present invention can be practiced even in circuit configurations and electrode arrangements other than those in the preferred embodiments described above. Preferred embodiments of the present invention provide the advantageous effect of more positively ensuring isolation between the lines insofar as a module includes a duplexer having such a structure that at least a transmission filter and a reception filter are arranged respectively along opposite sides of a substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer module comprising:
   a plurality of sets of a transmission line to transfer a transmission signal, a reception line to transfer a reception signal, and an antenna line to transfer the transmission signal and the reception signal, wherein the transmission line, the reception line, and the antenna line are connected to one another;
   a transmission filter inserted in the transmission line of each of the plurality of sets and allowing passage of the transmission signal;
   a reception filter inserted in the reception line of each of the plurality of sets and allowing passage of the reception signal;
   a module substrate including, in a first principal surface thereof, a plurality of transmission filter mount terminals to which the transmission filters of the plurality of sets are mounted and a plurality of reception filter mount terminals to which the reception filters of the plurality of sets are mounted; and
   a high-frequency switch arranged to select the antenna line in one of the plurality of sets and to connect the selected antenna line to an antenna port; wherein
   the transmission filters are arranged along a first side of the module substrate; and
   the reception filters are arranged along a second side of the module substrate, the second side being positioned opposite to the first side.

2. The duplexer module according to claim 1, wherein phase adjusting circuits to be disposed at respective points connecting the antenna line, the transmission filter, and the reception filter of the plurality of sets are arranged between the transmission filters and the reception filters of the plurality of sets, and
   the transmission filters and the reception filters are arranged such that respective electrodes of the transmission filters and the reception filters, which are connected to the phase adjusting circuits, are adjacent to the phase adjusting circuits.

3. The duplexer module according to claim 1, wherein interconnection lines constituting the transmission lines, interconnection lines constituting the reception lines, and interconnection lines constituting the antenna lines are arranged at different positions in a direction perpendicular to the first principal surface of the module substrate.

4. The duplexer module according to claim 2, wherein each of the phase adjusting circuits includes a capacitor inserted between a connecting point at which the transmission line, the reception line, and the antenna line of each of the plurality of sets are connected and the high-frequency switch, and an inductor inserted between the connecting point and a ground.

5. The duplexer module according to claim 1, wherein the transmission filters disposed in the transmission lines are constituted as one discrete component, and the reception filters disposed in the reception lines are constituted as one discrete component.

6. The duplexer module according to claim 1, wherein the high-frequency switch and the phase adjusting circuits are arranged in different ones of the first principal surface of the module substrate and a second principal surface of the module substrate opposite to the first principal surface of the module substrate.

* * * * *